United States Patent
Cho et al.

(10) Patent No.: US 7,545,171 B2
(45) Date of Patent: Jun. 9, 2009

(54) INPUT/OUTPUT DEVICE WITH FIXED VALUE DURING SLEEP MODE OR AT A TIME OF SUPPLYING INITIAL VOLTAGE TO SYSTEM

(75) Inventors: Sung-Hoon Cho, Gyeonggi-do (KR); Jae-Young Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/895,931

(22) Filed: Aug. 28, 2007

(65) Prior Publication Data
US 2008/0048755 A1    Feb. 28, 2008

(30) Foreign Application Priority Data
Aug. 28, 2006    (KR) .................... 10-2006-0081753

(51) Int. Cl.
*H03K 19/0175* (2006.01)
*H03L 5/00* (2006.01)

(52) U.S. Cl. .................. 326/63; 326/68; 326/80; 326/81; 327/333

(58) Field of Classification Search ............. 326/62–63, 326/68, 80–81; 327/333
See application file for complete search history.

(56) References Cited

U.S. PATENT DOCUMENTS

| 6,566,932 | B2 | 5/2003 | Yoon | |
|---|---|---|---|---|
| 6,600,358 | B1 | 7/2003 | Chan | |
| 2002/0153934 | A1* | 10/2002 | Yoon | 327/333 |

FOREIGN PATENT DOCUMENTS

| JP | 10-84274 | 3/1998 |
|---|---|---|
| JP | 2003-17996 | 1/2003 |
| KR | 2002-0080910 | 10/2002 |

* cited by examiner

*Primary Examiner*—Rexford Barnie
*Assistant Examiner*—Thienvu V Tran
(74) *Attorney, Agent, or Firm*—Mills & Onello, LLP (57) ABSTRACT

An input/output device includes: a level shifter configured to convert an input signal of a first voltage into an output signal of a second voltage; and an output driver configured to operate in response to the output signal. The level shifter is configured to generate the output signal with a predetermined level when the first voltage is interrupted to supply.

13 Claims, 4 Drawing Sheets

INPUT/OUTPUT DEVICE WITH FIXED VALUE DURING SLEEP MODE OR AT A TIME OF SUPPLYING INITIAL VOLTAGE TO SYSTEM

CROSS-REFERENCE TO RELATED APPLICATIONS

This U.S. non-provisional patent application claims priority under 35 U.S.C. § 119 to Korean Patent Application No. 10-2006-0081753 filed on Aug. 28, 2006, the entire contents of which are hereby incorporated by reference.

BACKGROUND

The present invention disclosed herein relates to semiconductor devices and more particularly, to input/output devices including level shifters.

In a general system-on-chip (SOC), power is supplied into blocks by means of plural power source voltages. This is because internal blocks of an SOC are different from each other in operation voltage. As these blocks with different operation voltages are also different from each other in signal level, there can be problem related to signal transmissions. For instance, in a case that an operation voltage of a CPU is 1.2V and an operation voltage of an input/output device is 3.3V, the input/output device can regard even a high level signal of 1.2V, which is transferred to an external system through the input/output device from the CPU, as a low level signal, which causes a functional error therein. Further, owing to differences of operation voltages, there would be leakage currents toward the CPU from the input/output device. To solve those problems, an input/output device usually includes a level shifter or a level conversion circuit.

If the SOC is in a normal mode, the level shifter receives an internal power source, which is an operation voltage of the CPU, and an operation voltage of the input/output device and converts the input internal power source voltage into the same level as the operation voltage of the input/output device. Thus, the level shifter is helpful to preventing the leakage current and functional error due to different operation voltages between blocks in the SOC.

Otherwise, if the SOC is in an initial state of a voltage supply or in a specific state (e.g., a sleep mode), the CPU turns to an off-state to interrupt the power supply. But the input/output device maintains an output value of a fixed level for interface with the external system and supplies power in order to keep an on-state.

As the CPU is in the off-state while the input/output device is active, the level shifter is supplied with power of the input/output device, not supplied with the internal power. Accordingly, an input of the level shifter is floated and an output of the level shifter is set to a value. Even though the SOC is conditioned in the initial voltage supply state or the specific state (e.g., a sleep mode), the input/output device is required to have an output value with a fixed level because it has to be in an on-state for interfacing with the external system. But, as an input of the level shifter is being floated, its output is set to a value that is not the fixed level. Thus, even though a system requires an output value with a fixed level, i.e., although it requires a fixed output value of a low level, another fixed value of a high level would be output therefrom. As a result, the system cannot be assured of reliable operation in input/output processing.

SUMMARY OF THE INVENTION

The present invention is directed to provide an input/output device including a level shifter operable in an output value with fixed level even when an input is being floated.

According to an aspect of the present invention, an input/output device includes: a level shifter configured to convert an input signal of a first voltage into an output signal of a second voltage; and an output driver configured to operate in response to the output signal. The level shifter is configured to generate the output signal with a predetermined level when the first voltage is interrupted.

The output driver can be supplied with the second voltage.

The predetermined level can be one of the second voltage and a ground voltage.

The input/output device can further include an input circuit supplied with the first voltage and can be configured to transfer the input signal to the level shifter.

An output of the input circuit can be floated when the first voltage is interrupted.

The level shifter can be configured to generate the output signal of the predetermined level when the output of the input circuit is floated.

The level shifter can include: a floating protection circuit supplied with the second voltage and configured to operate in response to the input signal; and a level shifting circuit configured to generate the output signal of the second voltage in response to an output of the floating protection circuit.

The floating protection circuit can be configured to prevent an input of the level shifting circuit from being floated when the first voltage is interrupted.

The floating protection circuit can include: a first resistor connected between a first input of the level shifting circuit and the second voltage; an NMOS transistor connected between the first input of the level shifting circuit and a ground voltage, responsive to the input signal; and a second resistor connected between the ground voltage and a second input of the level shifting circuit supplied with the input signal.

The floating protection circuit can include: a second resistor connected between a first input of the level shifting circuit and a ground voltage; an inverter configured to transfer the input signal to the first input of the level shifting circuit; a first resistor connected between a second input of the level shifting circuit and the second voltage; and an NMOS transistor connected between the second input of the level shifting circuit and the ground voltage, responsive to an output of the inverter.

According to another aspect of the present invention, an input/output device includes: an input circuit supplied with a first voltage and configured to receive an input signal to be transferred for level shifting; a level shifting circuit supplied with a second voltage different from a first voltage; and a floating protection circuit configured to transfer an output of the input circuit to the level shifting circuit. The floating protection circuit prevents an input of the level shifting circuit from being floated when the first voltage is interrupted.

The level shifting circuit can be configured to generate an output signal of a predetermined level when the first voltage is interrupted.

The predetermined level can be one of the second voltage and a ground voltage.

The output of the input circuit can be floated when the first voltage is interrupted.

The floating protection circuit can include: a first resistor connected between a first input of the level shifting circuit and the second voltage; an NMOS transistor connected between the first input of the level shifting circuit and a ground voltage, responsive to the input signal; and a second resistor connected between the ground voltage and a second input of the level shifting circuit supplied with the input signal.

The floating protection circuit can include: a second resistor connected between a first input of the level shifting circuit and a ground voltage; an inverter configured to transfer the input signal to the first input of the level shifting circuit; a first resistor connected between a second input of the level shifting circuit and the second voltage; and an NMOS transistor connected between the second input of the level shifting circuit and a ground voltage, responsive to an output of the inverter.

A further understanding of the nature and advantages of aspects of the present invention herein can be realized by reference to the remaining portions of the specification and the attached drawings.

BRIEF DESCRIPTION OF THE FIGURES

Non-limiting and non-exhaustive embodiments in accordance with the present invention will be described with reference to the following figures, wherein like reference numerals refer to like parts throughout the various figures unless otherwise specified. In the figures.

DETAILED DESCRIPTION OF PREFERRED EMBODIMENTS

Hereinafter, aspects of the present invention will be described by explaining illustrative embodiments in accordance therewith, with reference to the attached drawings. The present invention can, however, be embodied in different forms and should not be constructed as limited to the embodiments set forth herein. Like reference numerals refer to like elements throughout the accompanying figures.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 1:
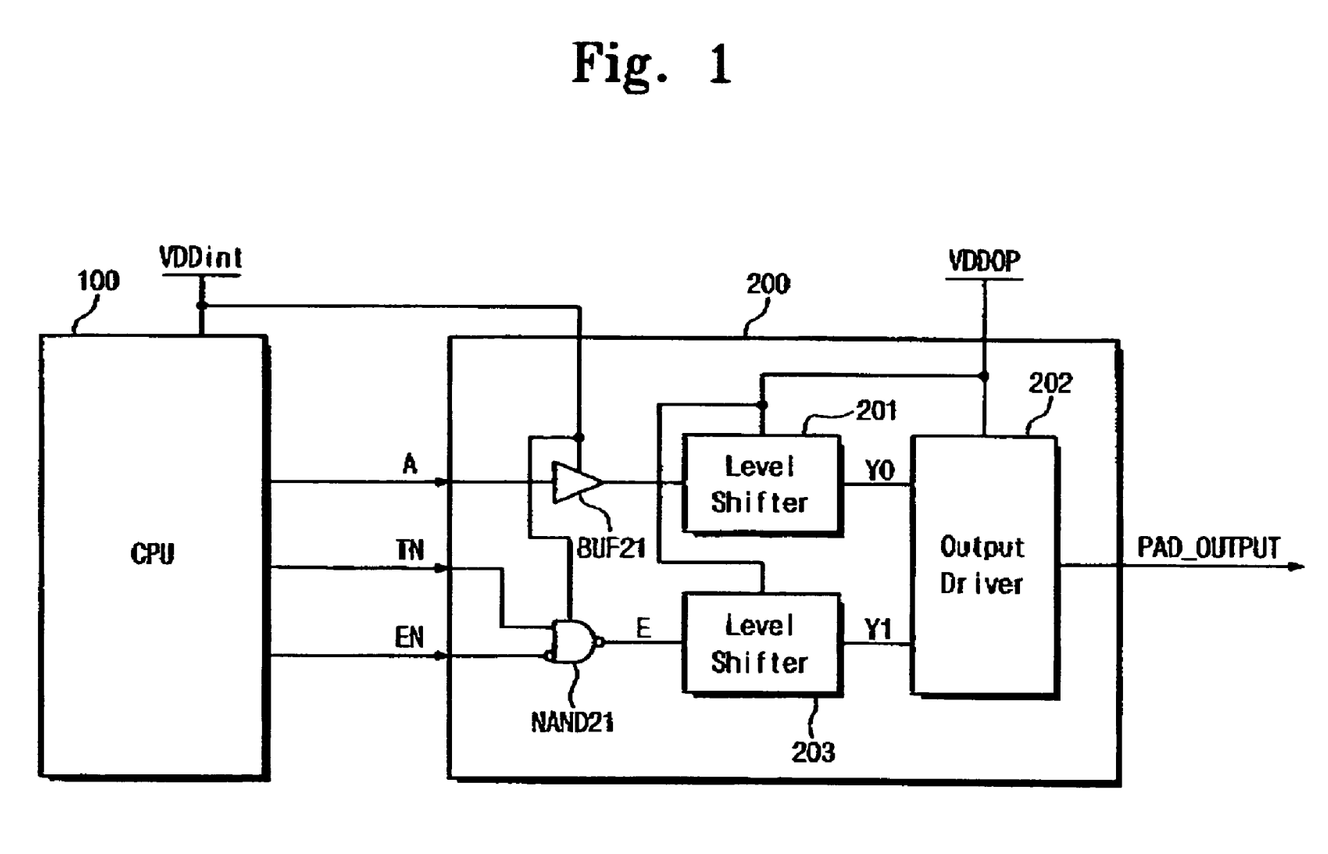
FIG. 1 is a block diagram illustrating a preferred embodiment of an input/output device in accordance with an aspect of the present invention.

FIG. 1 is a block diagram illustrating a preferred embodiment of an input/output device in accordance with an aspect of the present invention.

Referring to FIG. 1, the input/output device 200 is comprised of a buffer BUF21, a NAND gate NAND21, level shifters 201 and 203, and an output driver 202.

The level shifters 201 and 203 are the same in structure and operation, in this embodiment.

A CPU 100, the buffer BUF21, and the NAND gate NAND21 are supplied with a first operation voltage VDDint, while the level shifters 201 and 203 and the output driver 202 are supplied with a second operation voltage VDDOP. The first and second operation voltages, VDDint and VDDOP, are different from each other. For instance, the second operation voltage VDDOP is higher than the first operation voltage VDDint. The first and second operation voltages VDDint and VDDOP are also referred to herein as first and second voltages.

The input/output device 200 receives an input signal A and control signals TN and EN from the CPU 100. The input signal A is an address or data, the control signal TN is a test-enabling signal, and the control signal EN is an enabling signal. The input signal A applied to the input/output device 200 is transferred to the level shifter 201 through the buffer BUF21. The control signals TN and EN applied to the input/output device 200 are logically combined through the NAND gate NAND21, and output as a control signal E logically to the level shifter 203.

The buffer BUF21 and the NAND gate NAND21 can form an input circuit. The input circuit receives the input signal A and the control signals TN and EN.

If the system shown in FIG. 1 is in a normal mode, the level shifter 201 receives the input signal A and generates a signal Y0 corresponding to the input signal A in accordance with a power level of the input/output device 200. The level shifter 203 receives the control signal E and generates a control signal Y1 corresponding to the control signal E in accordance with a power level of the input/output device 200. For example, if the first operation voltage VDDint is 1.2V and the second operation voltage VDDOP is 3.3V, the high level (H) of the input signal A provided to the level shifter 201 and the control signal E applied to the level shifter 203 is 1.2V. The high level (H) of the output signals Y0 and Y1 respectively from the level shifters 201 and 203 is 3.3V.

If the input signal A is 1.2V of a high level, the level shifter 201 outputs the input signal A of a high level at 3.3V in accordance with the level of the second operation voltage VDDOP supplied to the input/output device 200. The level shifter 201 outputs a low level signal when the input signal A is a low level signal. The level shifter 203 operates in the same pattern with the level shifter 201. Namely, if the control signal E is 1.2V of a high level, the level shifter 203 outputs the control signal E of a high level at 3.3V in accordance with the level of the second operation voltage VDDOP supplied to the input/output device 200. The level shifter 203 outputs a low level signal when the control signal E is a low level signal.

In summary, while the system is in a normal mode, the level shifters 201 and 203 convert levels of their corresponding input signals A and E into the level of the second operation voltage VDDOP supplied to the input/output device 200.

The output driver 202, during the normal mode of the system, receives the signals Y0 and Y1 output each from the level shifters 201 and 203 and then determines a pad output signal PAD_OUTPUT in response to the signals Y0 and Y1. The pad output signal PAD_OUTPUT is transferred to an external system (not shown).

When the system is in the initial voltage supply state or a specific state (e.g., a sleep mode), the CPU 100 becomes in an off-state and there is no supply of the first operation voltage VDDint thereto. As the supply of the first operation voltage VDDint is interrupted, the buffer BUF21 and the NAND gate NAND21 of the input/output device 200 are also turned off. As the buffer BUF21 and the NAND gate NAND21 of the input/output device 200 are turned off, the inputs of the level shifters 201 and 203 are floated.

When the system is in the initial voltage supply state or a specific state (e.g., a sleep mode), the CPU 100 is in an off-state, but the input/output device 200 maintains an output value of fixed level for interfacing with the external system and is supplied with the second operation voltage VDDOP for its on-state. Thus, the level shifters 201 and 203 and the output driver 202 are continuously supplied with the second operation voltage VDDOP. The level shifters 201 and 203 include a floating protection circuit (refer to FIG. 2) activated by the second operation voltage VDDOP. When the system is in the initial voltage supply state or a specific state (e.g., a sleep mode), the inputs of the level shifters 201 and 203 are floated, but the level shifters including the floating protection circuit output signals at fixed levels.

The output driver 202, when the system is in the initial voltage supply state or a specific state (e.g., a sleep mode), receives the signals Y0 and Y1 of fixed levels from the level shifters 201 and 203 and generates the pad output signal PAD_OUTPUT of a fixed level in response to the signals Y0 and Y1 input thereto. The pad output signal PAD_OUTPUT is transferred to the external system.

Figure 2:
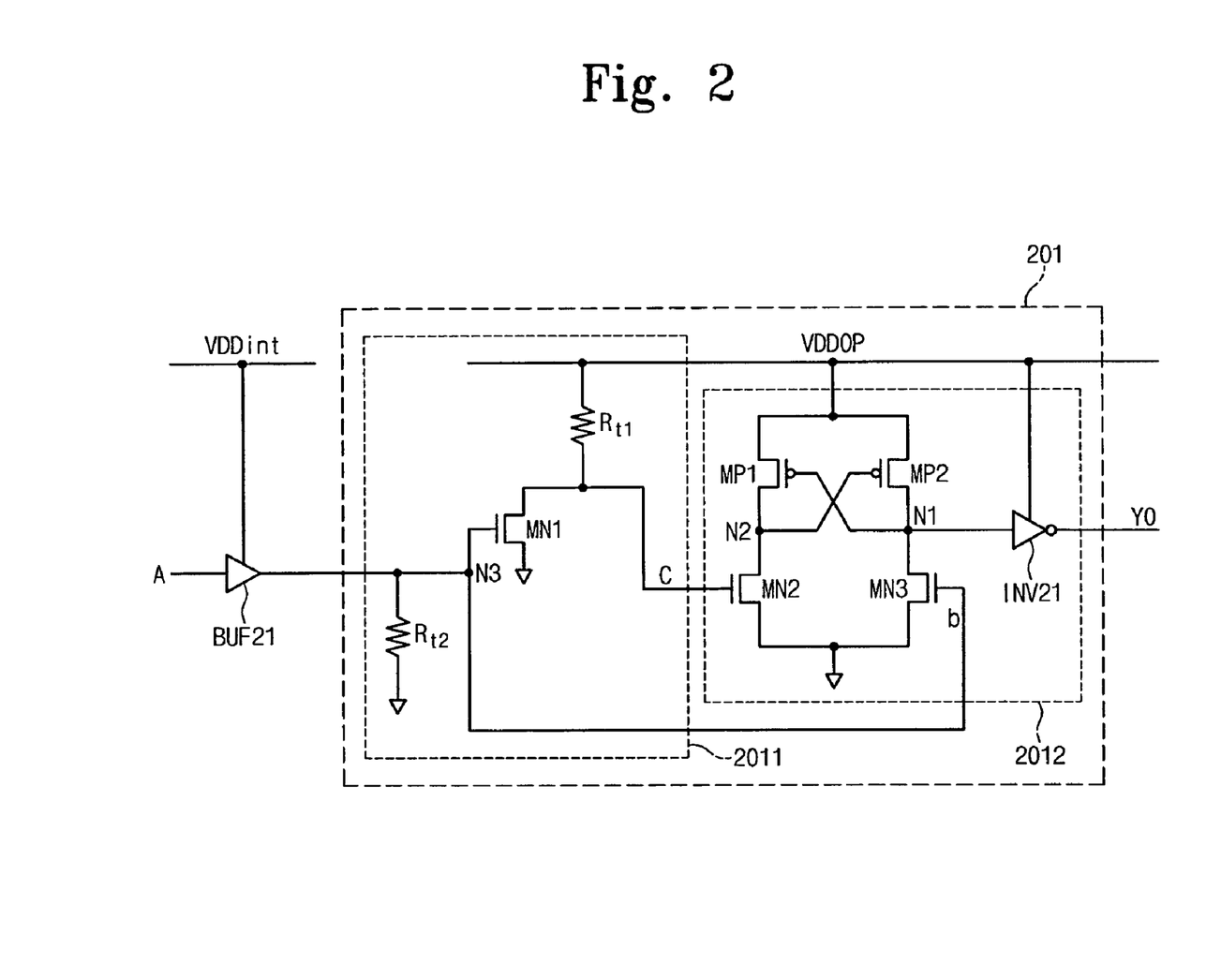
FIG. 2 is a circuit diagram illustrating an embodiment of the level shifter shown in FIG. 1.

FIG. 2 is a circuit diagram illustrating an embodiment of the level shifter shown in FIG. 1.

Referring to FIG. 2, the level shifter 201 according to a preferred embodiment is comprised of a floating protection circuit 2011 and a level shifting circuit 2012.

The floating protection circuit 2011 includes a pull-up resistor Rt1, a pull-down resistor Rt2, and an NMOS transistor MN1. A drain of the NMOS transistor MN1 is connected to a gate of an NMOS transistor MN2 of the level shifting circuit 2012 and coupled to the second operation voltage VDDOP through the pull-up resistor Rt1. A source of the NMOS transistor MN1 is connected to a ground GND. A gate of the NMOS transistor MN1 is connected to a gate of an NMOS transistor MN3 of the level shifting circuit 2012 and an output node of the buffer BUF21, which is turned on or off by the first operation voltage VDDint. A node N3 is connected to the ground GND by way of the pull-down resistor Rt2.

The pull-up resistor Rt1 is referred to as a first resistor and the pull-down resistor Rt2 is referred to as a second resistor.

The level shifting circuit 2012 includes PMOS transistors MP1 and MP2, the NMOS transistors MN2 and MN3, and an inverter INV21.

Sources of the PMOS transistors MP1 and MP2 are coupled to the second operation voltage VDDOP in common. A gate of the PMOS transistor MP1 is connected to drains of the PMOS and NMOS transistors MP2 and MN3 through a node N2. A gate of the PMOS transistor MP2 is connected to drains of the PMOS and NMOS transistors MP1 and MN2 through a node N2. A node N1 is connected to the output Y0 through the inverter INV21. The inverter INV21 is supplied with the second operation voltage VDDOP. Sources of the NMOS transistors MN2 and MN3 are connected to the ground GND in common.

The gate of the NMOS transistor MN2 is referred to as a first input node and the gate of the NMOS transistor MN3 is referred to as a second input node.

In a normal mode of the system, the first operation voltage VDDint is supplied into the input/output device 200 and the buffer BUF21 is turned on. The second operation voltage VDDOP is supplied into the input/output device 200 and thereby the level shifter 201 is supplied with the second operation voltage VDDOP. As the level shifter 201 is supplied with the second operation voltage VDDOP, the floating protection circuit 2011 is supplied with the second operation voltage VDDOP by way of the pull-up resistor Rt1.

The floating protection circuit 2011 receives the signal A from the CPU 100 through the buffer BUF21 turned on or off by the first operation voltage VDDint. During the normal mode of the system, as the buffer BUF21 is turned on by the first operation voltage VDDint, the floating protection circuit 2011 receives the signal A from the CPU 100 through the buffer BUF21.

When the signal A input to the floating protection circuit 2011 is at a high level (H), the level shifter 201 operates as follows.

When the system is in the normal mode, the level shifter 201 receives the signal A of a high level from the CPU 100 through the buffer BUF21 being turned on by the first operation voltage VDDint, and provides the signal A to the floating protection circuit 2011 of the level shifter 201. During this, the pull-down resistor Rt2 of the floating protection circuit 2011 is not conductive and a potential of the node N3 becomes at a high level because the input signal A is at a high level. As the node N3 is at a high level in potential, the high level signal is input to the gate of the NMOS transistor MN1. Then, the NMOS transistor MN1 is turned on by the high level signal. As the NMOS transistor MN1 is turned on, the pull-up resistor Rt1 becomes nonconductive and a low level signal is applied to the gate of the NMOD transistor MN2 of the level shifting circuit 2012.

The level shifting circuit 2012 of the level shifter 201 is supplied with the second operation voltage VDDOP through the sources of the PMOS transistors MP1 and MP2 since the second operation voltage VDDOP is supplied to the input/output device 200. The gate of the NMOS transistor MN2 of the level shifting circuit 2012 receives a low level signal from the floating protection circuit 2011. Then, the NMOS transistor MN2 is turned on by the low level signal applied thereto. The gate of the NMOS transistor MN3 of the level shifting circuit 2012 receives a high level signal from the floating protection circuit 2011. Then, the NMOS transistor MN3 is turned on by the high level signal applied thereto.

As the NMOS transistor MN3 of the level shifting circuit 2012 is turned in, a voltage of the node N1 becomes at a low level. As the voltage of the node N1 is at a low level, the gate of the PMOS transistor MP1 receives a low level signal. Thus, the PMOS transistor MP1 is turned on by the low level signal applied thereto.

As the NMOS transistor MN2 of the level shifting circuit 2012 is turned off, a voltage of the node N2 becomes high level. As the voltage of the node N2 is high level, the gate of the PMOS transistor MP2 receives a high level signal. Thus, the PMOS transistor MP2 is turned off by the high level signal applied thereto.

The PMOS transistors MP1 and MP2 are supplied with the second operation voltage VDDOP through their sources and the drains of the PMOS transistors MP1 and MP2 are connected to the nodes N1 and N2, respectively, so the node connected to a turned-on transistor is charged up to a high level by the second operation voltage VDDOP.

The PMOS transistor MP1 is turned on and a voltage of the node N2 becomes a high level. And, the PMOS transistor MP2 is turned off and a voltage of the node N1 becomes a low level. Thereby, the level shifting circuit 2012 outputs a high level signal through the inverter INV21 activated by the second operation voltage VDDOP. As a result, the high level signal output from the level shifting circuit 2012 is a signal obtained by converting a voltage level of the signal A, which is input from the CPU 100, into the level of the second operation voltage VDDOP supplied to the level shifter 201.

As aforementioned, the level shifting circuit 2012 converts a voltage level of the high level signal A, which is input to the level shifter 201, into the high level of the second operation voltage VDDOP, and transfers the converted high level signal Y0 to the output driver 202.

If the signal A input from the CPU is at a low level, the level shifter 201 generates the signal Y0 of a low level corresponding thereto. The low level signal Y0 is transferred to the output driver 202. An operation of the level shifter 201 when the signal A from the CPU 100 is a low level is reverse to the case when the signal A from the CPU 100 is high level, so will not be described in detail.

When the system is in the initial voltage supply state or a specific state (e.g., a sleep mode), as the first operation voltage VDDint is not supplied to the input/output device 200, the buffer BUF21 is conditioned in an off-state. During this, the second operation voltage VDDOP is supplied to the input/output device 200, so that the level shifter 201 is supplied with the second operation voltage VDDOP. As the level shifter 201 is supplied with the second operation voltage VDDOP, the floating protection circuit 2011 is supplied with the second operation voltage VDDOP through the pull-up resistor Rt1.

The floating protection circuit 2011 receives the signal A from the CPU 100 through the buffer BUF21, which is turned on or off by the first operation voltage VDDint. When the system is in the initial voltage supply state or a specific state (e.g., a sleep mode), the buffer BUF21 is conditioned in an off-state because there is no supply of the first operation voltage VDDint. As the buffer BUF21 is turned off, the input of the floating protection circuit 2011 is conditioned in a floating state. Thus, a value of the input signal A of the floating protection circuit 2011 is unknown.

During this, a potential of the node N3 becomes at a low level through the pull-down resistor Rt2. As the potential of the node N3 is low level, a low level signal is applied to the gate of the NMOS transistor MN1. The low level signal turns the NMOS transistor MN1 off. As the NMOS transistor MN1 is turned off, the pull-up resistor Rt1 turns to be conductive and the second operation voltage VDDOP is applied to the gate of the NMOS transistor MN2 of the level shifting circuit by way of the pull-up resistor Rt1. A high level signal is applied to the gate of the NMOS transistor MN2 of the level shifting circuit 2012.

As aforementioned, the floating protection circuit 2011 of the level shifter 201 generates a fixed level signal capable of operating the level shifter 201 when a value of the input signal A is unknown because the input is floated, in the condition that the system is being in the initial voltage supply state or a specific state (e.g., a sleep mode), and provides the fixed level signal to the level shifting circuit 2012 of the level shifter 201.

As the second operation voltage VDDOP is supplied to the input/output device 200, the level shifting circuit 2012 of the level shifter 201 is supplied with the second operation voltage VDDOP through sources of the PMOS transistors MP1 and MP2. The gate of the NMOS transistor MN2 of the level shifting circuit 2012 receives a high level signal from the floating protection circuit 2011. The NMOS transistor MN2 is turned on by the high level signal applied to its gate. The gate of the NMOS transistor MN3 of the level shifting circuit 2012 receives a low level signal from the floating protection circuit 2011. The NMOS transistor MN3 is turned off by the low level signal applied to its gate.

As the NMOS transistor MN3 of the level shifting circuit 2012 is turned off, a voltage of the node N1 goes to high level. As the voltage of the node N1 is high level, a gate of the PMOS transistor MP1 receives a high level signal. The PMOS transistor MP1 is turned off by the high level signal applied to its gate.

As the NMOS transistor MN2 of the level shifter 2012 is turned on, a voltage of the node N2 goes to low level. As the voltage of the node N2 is at a low level, a gate of the PMOS transistor MP2 receives a low level signal. The PMOS transistor MP2 is turned on by the low level signal applied to its gate.

The PMOS transistor MP1 is turned off and the voltage of the node N2 becomes low level. And, the PMOS transistor MP2 is turned off and the voltage of the node N1 becomes high level. Thereby, the level shifting circuit 2012 outputs a low level signal through the inverter INV21 turned on by the second operation voltage VDDOP.

As aforementioned, although the input of the level converter 201 is floated because there is no supply of the first operation voltage VDDint in the condition that the system is in the initial voltage supply state or a specific state (e.g., a sleep mode), the floating protection circuit 2011 activated by the second operation voltage VDDOP enables a fixed level signal of a low level to be output.

Figure 3:
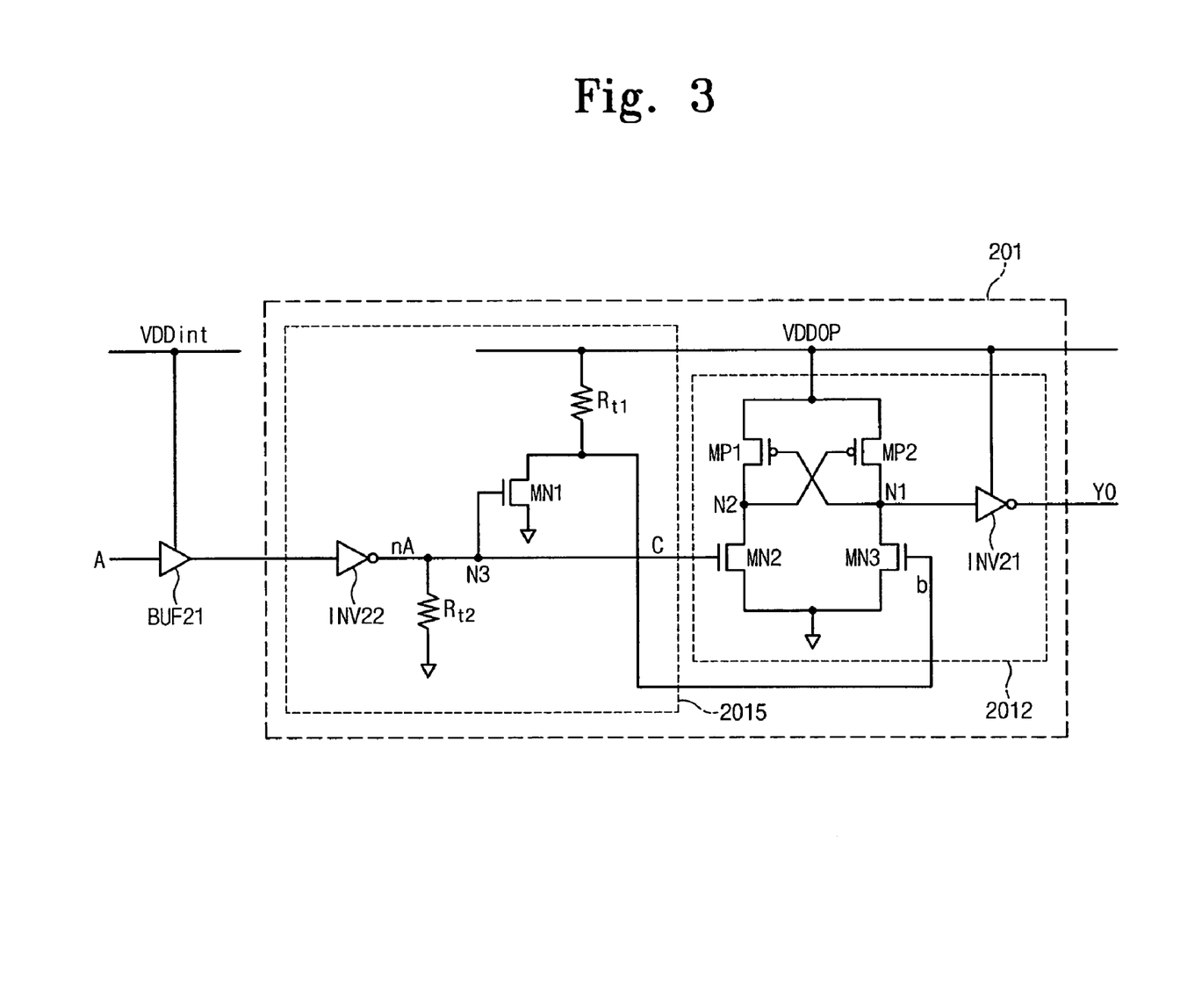
FIG. 3 is a circuit diagram illustrating another embodiment of the level shifter shown in FIG. 1.

FIG. 3 is a circuit diagram illustrating another embodiment of the level shifter shown in FIG. 1.

Referring to FIG. 3, the level shifter 201 according to this embodiment of the present invention is comprised of a floating protection circuit 2015 and the level shifting circuit 2012.

The floating protection circuit 2015 is different from the floating protection circuit 2011 of FIG. 2 in that: the drain of the NMOS transistor MN1 is connected to the gate of the NMOS transistor MN3 of the level shifting circuit 2012; the gate of the NMOS transistor MN1 is connected to the gate of the NMOS transistor MN2 of the level shifting circuit 2012 and an output node of an inverter INV22 by way of the node N3; and the signal A input through the buffer BUF21 is inverted by the inverter INV22. The remainder of the circuit configuration of the floating protection circuit 2015 is the same as the floating protection circuit 2011 shown in FIG. 2.

In the floating protection circuit 2015, the pull-up resistor Rt1 is referred to as the first resistor and the pull-down resistor Rt2 is referred to as the second resistor.

The structure of the level shifting circuit 2012 is as same as that shown in FIG. 2.

In the normal mode of the system, the first operation voltage VDDint is supplied to the input/output device 200 and then the buffer BUF21 is turned on. The second operation voltage VDDOP is supplied to the input/output device 200 and thereby the level shifter 201 is supplied with the second operation voltage VDDOP. As the level shifting circuit 201 is supplied with the second operation voltage VDDOP, the floating protection circuit 2011 is charged with the second operation voltage VDDOP through the pull-up resistor Rt1.

The floating protection circuit 2015 receives the signal A from the CPU 100 by way of the buffer BUF21, which is turned on or off by the first operation voltage VDDint. As the buffer BUF21 is turned on by the first operation voltage VDDint, the floating protection circuit 2015 receives the signal A from the CPU 100 through the buffer BUF21.

Hereinafter is described about an operation of the level shifter 201 when the signal A is high level.

In the normal mode of the system, the level shifter 201 receives the high level signal A from the CPU 100 by way of the buffer BUF21, which is turned on by the first operation voltage VDDint, and provides the high level signal A to the floating protection circuit 2015 of the level shifter 201. The high level signal A is inverted into a low level signal nA through the inverter INV22 of the floating protection circuit 2015.

During this, the pull-down resistor Rt2 of the floating protection circuit 2015 is nonconductive and the input signal A is inverted by the inverter INV22, so that a voltage of the node N3 becomes at a low level. As the voltage of the node N3 is transitions to low level, the low level signal is applied to the gate of the NMOS transistor MN1 and then the NMOS transistor MN1 is turned off by the low level signal. As the NMOS transistor MN1 is turned off, the pull-up resistor Rt1 becomes conductive to apply the second operation voltage VDDOP to the gate of the NMOS transistor MN3. Thus, a high level signal is applied to the gate of the NMOS transistor MN3 of the level shifting circuit 2012. Further, as the voltage of the node N3 is at a low level, a low level signal is applied to the gate of the NMOS transistor MN2 of the level shifting circuit 2012.

When the low level signal is applied to the gate of the NMOS transistor MN2 of the level shifting circuit 2012 and the high level signal is applied to the gate of the NMOS transistor MN3, the operation of the level shifting circuit 2012 is the same as that of the level shifting circuit shown in FIG. 2.

In summary, the level shifting circuit 2012 converts the high level signal A, which is input to the level shifter 201, into the high level of the second operation voltage VDDOP supplied thereto and provides the driver 202 with the high level signal Y0 converted thereby.

If the signal A input from the CPU 100 is a low level, the level shifting circuit 201 generates a low level signal Y0 corresponding thereto and outputs the low level signal Y0 to the output driver 202. An operation of the level shifter 201 when the signal A input from the CPU 100 is at a low level is the reverse of the aforementioned case when the signal A input from the CPU 100 is at a high level, so a detailed description thereof is omitted.

When the system is in the initial voltage supply state or a specific state (e.g., a sleep mode), the first operation voltage VDDint is not supplied to the input/output device VDDint and thus the buffer BUF21 is turned off. And, as the second operation voltage VDDOP is supplied to the input/output device 200, the level shifter 201 is supplied with the second operation voltage VDDOP. As the level shifter 201 is supplied with the second operation voltage VDDOP, the floating protection circuit 2015 is supplied with the second operation voltage VDDOP through the pull-up resistor Rt1.

The floating protection circuit 2015 receives the signal A from the CPU 100 by way of the buffer BUF21, which is turned on or off by the first operation voltage VDint. When the system is in the initial voltage supply state or a specific state (e.g., a sleep mode), the buffer BUF21 is turned off because there is no supply of the first operation voltage VDDint. As the buffer BUF21 is conditioned in an off-state, the input of the floating protection circuit 2015 is floated. Therefore, a value of the input signal A to the floating protection circuit 2015 is unknown.

During this, the pull-down resistor Rt2 is conductive to make a voltage of the node N3 be at a low level. As the voltage of the node N3 is at a low level, a low level signal is applied to the gate of the NMOS transistor MN1 and the NMOS transistor MN1 is turned off by the low level signal. As the NMOS transistor MN1 is turned off, the pull-up resistor Rt1 becomes conductive to apply the second operation voltage VDDOP to the gate of the NMOS transistor MN3 of the level shifting circuit 2012. Thus, a high level signal is applied to the gate of the NMOS transistor MN3 of the level shifting circuit 2012.

Therefore, in the initial voltage supply state or a specific state (e.g., a sleep mode) of the system, when a value of the input signal A is unknown due to the floating state of the input, the floating protection circuit 2015 generates a fixed signal capable of operating the level shifter 201 regardless of the input signal A and provides the generated fixed signal to the level shifting circuit 2012 of the level shifter 201.

The level shifting circuit 2012 of the level shifter 201 is supplied with the second operation voltage VDDOP through the sources of the PMOS transistors MP1 and MP2, since the second operation voltage VDDOP is supplied to the input/output device 200. The gate of the NMOS transistor MN2 of the level shifting circuit 2012 receives a low level signal from the floating protection circuit 2015 and the NMOS transistor MN2 is turned off in response to the low level signal. The gate of the NMOS transistor MN3 of the level shifting circuit 2012 receives a high level signal from the floating protection circuit 2015 and the NMOS transistor MN3 is turned on in response to the high level signal.

As the NMOS transistor MN3 of the level shifting circuit 2012 is turned on, a voltage of the node N1 becomes at a low level. As the voltage of the node N1 is at a low level, the gate of the PMOS transistor MP1 receives a low level signal and the PMOS transistor MP1 is turned on by the low level signal.

As the NMOS transistor MN2 of the level shifting circuit 2012 is turned off, a voltage of the node N2 becomes at a high level. As the voltage of the node N2 is at a high level, the gate of the PMOS transistor MP2 receives a high level signal and the PMOS transistor MP2 is turned off by the high level signal.

Namely, the PMOS transistor MP1 is turned on and the voltage of the node N2 becomes at a high level. And, the PMOS transistor MP2 is turned off and the voltage of the node N1 becomes at a low level. Thereby, the level shifting circuit 2012 outputs a high level signal by way of the inverter INV21 of the level shifting circuit 2012 that is conditioned in an on-state by the second operation voltage VDDOP.

As a result, the level shifter 201 shown in FIG. 3 is able to output a fixed high level signal Y0 through including the floating protection circuit 2011 operating by the second operation voltage VDDOP, even though the input of the level shifter 201 is floated due to no supply of the first operation voltage VDDint, when the system is conditioned in the initial voltage supply state or a specific state (e.g., a sleep mode).

The floating protection circuit 2015 of the level shifter 201 shown in FIG. 3 is different from that shown in FIG. 2 in circuit interconnection, in order to output the fixed high level signal Y0 when the input of the level shifter 201 is floated. Namely, the drain of the NMOS transistor MN1 is connected to the gate of the NMOS transistor MN3 of the level shifting circuit 2012 and the gate of the NMOS transistor MN1 is connected to the gate of the NMOS transistor MN2 of the level shifting circuit 2012 through the node N3.

With this structure, the level shifter 201 including the floating protection circuit 2015 outputs the inverted level of the input signal A when the system is operating in the normal mode. Namely, the level shifter 201 outputs a low level signal from the input signal A having a high level. Thus, in order to prevent the output signal Y0, which corresponds to the input signal A, from being inverted, the level shifter 201 includes the inverter INV22 to invert the input signal A that is received through the buffer BUF21. As the signal A input through the buffer BUF21 is inverted by the inverter INV22, the level shifter 201 outputs the signal Y0 at the same level as the input signal A.

Figure 4:
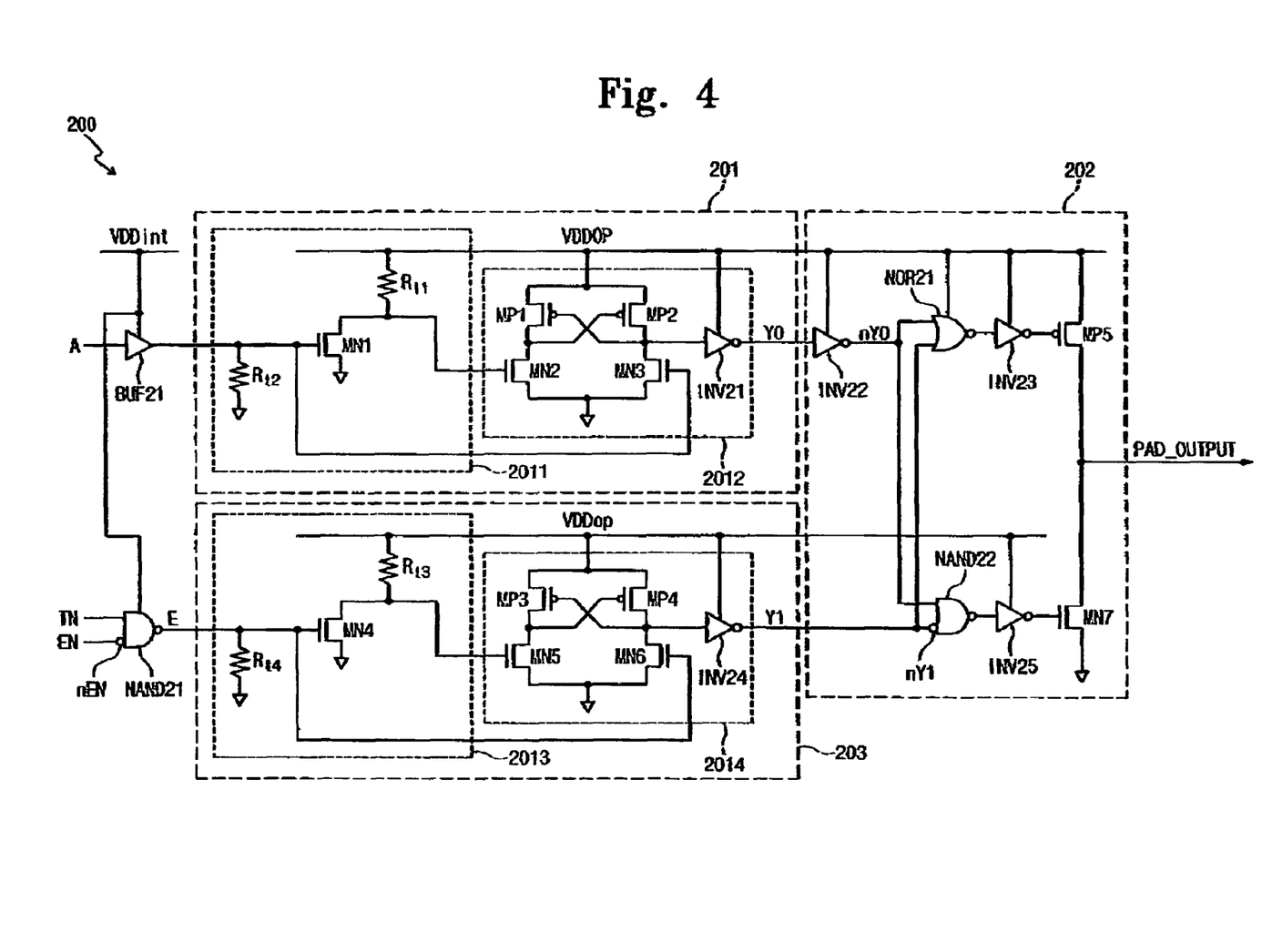
FIG. 4 is a circuit diagram of an embodiment of the output driver and the level shifter shown in FIG. 1.

FIG. 4 is a circuit diagram of an embodiment of the output driver and the level shifter shown in FIG. 1.

Referring to FIG. 4, the level shifters 201 and 203 according to the preferred embodiment are the same in structure and operation. Thus, the above description about the level shifter 201 of FIG. 2 will not be repeated here.

In the normal mode of the system, the first operation voltage VDDint is supplied to the input/output device 200 and then the buffer BUF21 is turned on. The second operation voltage VDDOP is supplied to the input/output device 200 and thereby the level shifter 201 is supplied with the second operation voltage VDDOP. As the level shifting circuit 201 is supplied with the second operation voltage VDDOP, the floating protection circuit 2011 is charged with the second operation voltage VDDOP through the pull-up resistor Rt1.

The floating protection circuit 2011 receives the signal A from the CPU 100 by way of the buffer BUF21, which is turned on or off by the first operation voltage VDDint. In the normal mode of the system, as the buffer BUF21 is turned on by the first operation voltage VDDint, the floating protection circuit 2011 receives the signal A from the CPU 100 through the buffer BUF21.

An operation of the level shifter 201 when the signal A input to the floating protection circuit 2011 is at a high level is same with that of the level shifter shown in FIG. 2.

Namely, in the normal mode of the system, if there is an input of the high level signal A from the CPU 100, the level shifter 201 converts the high level signal A into the high level of the second operation voltage VDDOP supplied thereto and provides the driver 202 with a high level signal Y0 converted thereby. If the signal A input from the CPU 100 is at a low level, the level shifter 201 generates a low level signal Y0 corresponding thereto and outputs the low level signal Y0 to the output driver 202.

When the system is in the initial voltage supply state or a specific state (e.g., a sleep mode), the first operation voltage VDDint is not supplied to the input/output device VDDint and thus the buffer BUF21 is turned off. And, as the second operation voltage VDDOP is supplied to the input/output device 200, the level shifter 201 is supplied with the second operation voltage VDDOP. As the level shifter 201 is supplied with the second operation voltage VDDOP, the floating protection circuit 2011 is supplied with the second operation voltage VDDOP through the pull-up resistor Rt1.

The floating protection circuit 2011 receives the signal A from the CPU 100 by way of the buffer BUF21, which is turned on or off by the first operation voltage VDint. When the system is in the initial voltage supply state or a specific state (e.g., a sleep mode), the buffer BUF21 is turned off because there is no supply of the first operation voltage VDDint. As the buffer BUF21 is conditioned in an off-state, the input of the floating protection circuit 2011 is floated. Therefore, a value of the input signal A to the floating protection circuit 2011 is unknown.

As also, an operation of the level shifter 201 when the input of the floating protection circuit 2011 is floated is same with the case of FIG. 2.

Therefore, in the initial voltage supply state or a specific state (e.g., a sleep mode) of the system, when a value of the input signal A is unknown due to the floating state of the input, the floating protection circuit 2011 generates a fixed signal capable of operating the level shifter 201 regardless of the input signal A and provides the generated fixed signal to the level shifting circuit 2012 of the level shifter 201.

The level shifting circuit 2012 outputs the fixed low level signal in response to the signal input from the floating protection circuit 2011.

As a result, the level shifter 201 is able to output a fixed high level signal Y0 through the floating protection circuit 2011 operating by the second operation voltage VDDOP, even though the input of the level shifter 201 is floated due to no supply of the first operation voltage VDDint, when the system is conditioned in the initial voltage supply state or a specific state (e.g., a sleep mode).

In the normal mode of the system, as the first operation voltage VDDint is supplied to the input/output device 200, a NAND gate NAND21 is turned on. As the second operation voltage VDDOP is supplied to the input/output device 200, the level shifter 203 is supplied with the second operation voltage VDDOP.

A first input of the NAND gate NAND21 receives the control signal TN from the CPU 100 and a second input of the NAND gate NAND 21 receives a signal nEN, that is inverted from the control signal EN provided from the CPU 100. The NAND gate NAND21 generates a control signal E from combining the two control signals TN and nEN and provides the control signal E to the level shifter 203.

The level shifter 203 is the same as the level shifter 201 in circuit structure and operation. Therefore, if the control signal E is at a high level, the level shifter 203 converts a voltage level of the input signal A into a high level according to the high level of the second operation voltage VDDOP supplied to the level shifting circuit 2012 of the level shifter 203, and outputs the converted high level signal to the output driver 202. If the control signal E is at a low level, the level shifter 203 outputs a corresponding low level signal Y1 to the output driver 202.

In the initial voltage supply state or specific state (e.g., a sleep mode) of the system, as the first operation voltage VDDint is not supplied to the input/output device 200, the NAND gate NAND21 is turned off. As the second operation voltage VDDOP is supplied to the input/output device 200, the level shifter 203 is supplied with the second operation voltage VDDOP.

As the NAND gate NAND 21 is conditioned in an off-state, the input of the level shifter 203 is floated. Thus, a value of the signal A input to the level shifter 203 is unknown.

The level shifter 203 is the same as the level shifter 201 in structure and operation. Therefore, the level shifter 203 is able to output a fixed low level signal Y1 to the output driver 202 through the floating protection circuit 2013 enabled by the second operation voltage VDDOP, when the input is floated.

The output driver 202 is comprised of inverters INV22, INV23, and INV25, a NOR gate NOR21, a NAND gate NAND22, a PMOS transistor MP5, and an NMOS transistor MN7.

The components of the output driver 202, INV22, INV23, INV25, NOR21, and NAND22, are turned on or off by the second operation voltage VDDOP.

The output driver 202 receives the signal Y0 corresponding to the signal A input to the level shifter 201. The output driver 202 inverts the signal Y0 by way of the inverter INV22 and provides the inverted signal to first inputs of the NOR and NAND gates NOR21 and NAND22.

The output driver 202 receives the control signal Y1 corresponding to the control signal E input to the level shifter 203, and inputs the control signal Y1 into a second input of the NOR gate NOR21. The output driver 202 inverts the control signal Y1 and inputs the inverted signal nY1 to a second input of the NAND gate NAND22.

The NOR gate NOR21 of the output driver 202 logically combines the two signals nY0 and Y1, and provides a combined signal to a gate of the PMOS transistor MP5 through the inverter INV23.

The NAND gate NAND22 of the output driver 202 logically combines the two signals nY0 and nY1, and provides a combined signal to a gate of the NMOS transistor MN7 through the inverter INV25.

A source of the PMOS transistor MP5 of the output driver 202 is connected to the second operation voltage VDDOP. A drain of the PMOS transistor MP5 is connected to an output of the inverter INV23. A drain of the PMOS transistor MP5 is the pad output PAD_OUTPUT and a drain of the NMOS transistor MN7. The drain of the NMOS transistor MN7 of the output driver 202 is connected to the pad output PAD_OUTPUT and the drain of the PMOS transistor MP5. A gate of the NMOS transistor MN7 is connected to an output of the inverter INV25. A source of the NMOS transistor MN7 is connected to the ground GND.

The MOS transistors MP5 and MN7 of the output driver 202 operate to output the pad output signal PAD_OUTPUT, being turned on or off by their corresponding signals Y0' and Y1' applied each to their gates.

Thus, in the normal mode of the system, the output driver 202 receives the signals Y0 and Y1 output from the level shifters 201 and 203, and determines the pad output signal PAD_OUTPUT in response to the signals Y0 and Y1. The pad output signal PAD_OUTPUT is transferred to the external system (not shown).

The output driver 202 receives the signals Y0 and Y1 that are generated from the level shifters 201 and 203 with fixed levels, and outputs the pad output signal PAD_OUTPUT of fixed level in response to the signals Y0 and Y1, when the system is conditioned in the initial voltage supply state or a specific state (e.g., a sleep mode).

In summary, the input/output device in accordance with the present invention operates in a normal condition even when an input of the level shifter is floated, including a floating protection circuit enabled by an operation voltage. Thus, the input/output device has a pad output signal with a fixed level, offering stability of operation in the system.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An input/output device comprising:
a level shifter configured to convert an input signal of a first voltage into an output signal of a second voltage; and
an output driver configured to operate in response to the output signal,
wherein the level shifter is configured to generate the output signal with a predetermined level when the first voltage is interrupted,
wherein the level shifter comprises:
a floating protection circuit supplied with the second voltage and to operate in response to the input signal; and
a level shifting circuit configured to generate the output signal of the second voltage in response to an output of the floating protection circuit, wherein the floating protection circuit is configured to prevent an input of the level shifting circuit from being floated when the first voltage is interrupted, and wherein the floating protection circuit comprises:
a first resistor connected between a first input of the level shifting circuit and the second voltage;
an NMOS transistor connected between the first input of the level shifting circuit and a ground voltage, responsive to the input signal; and
a second resistor connected between the ground voltage and a second input of the level shifting circuit supplied with the input signal.

2. The input/output device as set forth in claim 1, wherein the output driver is supplied with the second voltage.

3. The input/output device as set forth in claim 1, wherein the predetermined level is one of the second voltage and a ground voltage.

4. The input/output device as set forth in claim 1, which further comprises:
an input circuit supplied with the first voltage and configured to transfer the input signal to the level shifter.

5. The input/output device as set forth in claim 4, wherein an output of the input circuit is floated when the first voltage is interrupted.

6. The input/output device as set forth in claim 5, wherein the level shifter is configured to generate the output signal of the predetermined level when the output of the input circuit is floated.

7. The input/output device as set forth in claim 1, wherein the floating protection circuit comprises:
a second resistor connected between a first input of the level shifting circuit and a ground voltage;
an inverter configured to transfer the input signal to the first input of the level shifting circuit;
a first resistor connected between a second input of the level shifting circuit and the second voltage; and
an NMOS transistor connected between the second input of the level shifting circuit and the ground voltage, responsive to an output of the inverter.

8. An input/output device comprising:
an input circuit supplied with a first voltage and configured to receive an input signal to be transferred for level shifting;
a level shifting circuit supplied with a second voltage different from the first voltage; and
a floating protection circuit configured to transfer an output of the input circuit to the level shifting circuit,
wherein the floating protection circuit is configured to prevent an input of the level shifting circuit from being floated when the first voltage is interrupted, and
wherein the floating protection circuit comprises:
a first resistor connected between a first input of the level shifting circuit and the second voltage;
an NMOS transistor connected between the first input of the level shifting circuit and a ground voltage, responsive to the input signal; and a second resistor connected between the ground voltage and a second input of the level shifting circuit supplied with the input signal.

9. The input/output device as set forth in claim 8, wherein the level shifting circuit is configured to generate an output signal of a predetermined level when the first voltage is interrupted.

10. The input/output device as set forth in claim 9, wherein the predetermined level is one of the second voltage and a ground voltage.

11. The input/output device as set forth in claim 8, wherein the output of the input circuit is floated when the first voltage is interrupted.

12. The input/output device as set forth in claim 8, wherein the floating protection circuit comprises:
   a second resistor connected between a first input of the level shifting circuit and a ground voltage;
   an inverter configured to transfer the input signal to the first input of the level shifting circuit;
   a first resistor connected between a second input of the level shifting circuit and the second voltage; and
   an NMOS transistor connected between the second input of the level shifting circuit and a ground voltage, responsive to an output of the inverter.

13. An input/output device, comprising:
   an input circuit supplied with a first voltage and configured to receive an input signal to be transferred for level shifting;
   a level shifting circuit supplied with a second voltage different from the first voltage; and
   a floating protection circuit configured to transfer an output of the input circuit to the level shifting circuit,
   wherein the floating protection circuit is configured to prevent an input of the level shifting circuit from being floated when the first voltage is interrupted, and
   wherein the floating protection circuit comprises:
      a second resistor connected between a first input of the level shifting circuit and a ground voltage;
      an inverter configured to transfer the input signal to the first input of the level shifting circuit;
      a first resistor connected between a second input of the level shifting circuit and the second voltage; and
      an NMOS transistor connected between the second input of the level shifting circuit and a ground voltage, responsive to an output of the inverter.

* * * * *